(12) United States Patent
Suzuki

(10) Patent No.: US 6,621,322 B2
(45) Date of Patent: Sep. 16, 2003

(54) VOLTAGE GENERATING CIRCUIT, LEVEL SHIFT CIRCUIT AND SEMICONDUCTOR DEVICE

(75) Inventor: Hisao Suzuki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/103,761

(22) Filed: Mar. 25, 2002

(65) Prior Publication Data

US 2003/0094988 A1 May 22, 2003

(30) Foreign Application Priority Data

Nov. 19, 2001 (JP) ....................................... 2001-353576

(51) Int. Cl.⁷ ............................................... H03L 5/00
(52) U.S. Cl. ....................................................... 327/333
(58) Field of Search ................................. 327/309, 319, 327/321, 327, 328, 333; 326/62, 63, 64, 68, 80–85

(56) References Cited

U.S. PATENT DOCUMENTS 5,852,372 A * 12/1998 Boeckmann et al. ......... 326/83
6,127,848 A * 10/2000 Wert et al. ..................... 326/81
6,194,944 B1 * 2/2001 Wert ........................... 327/327
6,255,888 B1 * 7/2001 Satomi ........................ 327/333
6,304,105 B1 * 10/2001 Fujiyoshi ..................... 326/81
6,462,602 B1 * 10/2002 Potter .......................... 327/333

* cited by examiner

*Primary Examiner*—My-Trang Nu Ton
(74) *Attorney, Agent, or Firm*—Arent Fox Kintner Plotkin & Kahn

(57) ABSTRACT

A level shift circuit which reliably shifts the level of a low-voltage input signal by using a high breakdown voltage element. The level shift circuit includes an input inverter circuit which receives an input signal and inverts the input signal to generate a first inverter signal, a voltage generating circuit which generates at least one intermediate voltage by voltage-dividing a voltage higher than a voltage of the input signal, a level shift inverter circuit which receives the intermediate voltage and the input signal, and an output inverter circuit. The level shift inverter circuit inverts the input signal to generate a level shift signal having an intermediate voltage. The output inverter circuit inverts the level shift signal to generate a level shift output signal.

19 Claims, 5 Drawing Sheets

US 6,621,322 B2

VOLTAGE GENERATING CIRCUIT, LEVEL SHIFT CIRCUIT AND SEMICONDUCTOR DEVICE

BACKGROUND OF THE INVENTION

The present invention relates to a level shift circuit, and, more particularly, to a level shift circuit which transfers signals of different supply voltages.

As the versatility of the functions of semiconductor integrated circuit devices is increasing, the supply voltages of the recent semiconductor integrated circuit devices decrease and each of the semiconductor devices has a plurality of different supply voltages. Such a semiconductor device has a level shift circuit connected between circuits which operate on different supply voltages. The level shift circuit is required to stably operate even on a low supply voltage.

FIG. 1 is a circuit diagram of a conventional level shift circuit 50. An inverter circuit 1 is connected to a second voltage supply (PS2: GND) and a third voltage supply PS3 having a third voltage (VD3: for example, 1 V) higher than a second voltage (VD2: 0 V) of the second voltage supply, and receives an input signal IN. The output terminal of the inverter circuit 1 is connected to the gate of an N channel MOS transistor (first transistor) Tr1. The first transistor Tr1 has a drain connected to the drain of a P channel MOS transistor (second transistor) Tr2 and a source connected to the ground GND. An output signal OUT is output from the drains of the first and second transistors Tr1 and Tr2.

The input signal IN is supplied to the gate of an N channel MOS transistor (third transistor) Tr3 whose drain is connected to the drain of a P channel MOS transistor (fourth transistor) Tr4 and whose source is connected to the ground GND.

For example, 3 V of a first voltage supply PS1 is supplied to the sources of the second and fourth transistors Tr2 and Tr4. The gate of the second transistor Tr2 is connected to the drain of the fourth transistor Tr4 whose gate is connected to the drain of the transistor Tr2.

In the level shift circuit 50, when the input signal IN has an H level (about 1 V), the inverter output signal of the inverter circuit 1 has an L level (nearly ground level: 0 V). When the inverter output signal has the L level, the first transistor Tr1 and the fourth transistor Tr4 are off. At this time, the third transistor Tr3 is enabled, thereby enabling the second transistor Tr2. As a result, the voltage of the output signal OUT is approximately equal to the first voltage VD1 (3 V).

When the input signal IN has an L level, the inverter output signal has an H level (nearly 1 V). The first transistor Tr1 is enabled in response to the H-level inverter output signal. Therefore, the voltage of the output signal OUT is approximately "0" V.

The level shift circuit 50 therefore generates the output signal OUT which changes between the first voltage VD1 (3 V) and "0" V in accordance with the input signal IN that changes between the third voltage VD3 (1 V) and "0" V. The level shift circuit 50 is an interface circuit connected between a circuit which operates on the first voltage VD1 and a circuit which operates on the third voltage VD3.

In the level shift circuit 50, when the first transistor Tr1 is off, the second transistor Tr2 is enabled, so that the drain-source voltage of the first transistor Tr1 is about 3 V (first voltage VD1). When the third transistor Tr3 is off, the fourth transistor Tr4 is enabled, so that the drain-source voltage of the third transistor Tr3 is about 3 V.

Therefore, the first and third transistors Tr1 and Tr3 are high breakdown voltage transistors that can endure the drain-source voltage of 3 V. By way of contrast, the transistors of the inverter circuit 1 are low breakdown voltage transistors that can endure the drain-source voltage of approximately 1 V (the third voltage VD3).

As indicated by a transistor characteristic in FIG. 2, however, the high breakdown voltage transistors are enabled by a higher gate-source voltage than the low breakdown voltage transistors. In a case where the third voltage VD3 is relatively low, therefore, the third transistor Tr3 may not be enabled sufficiently even when the input signal IN changes to an H level. Alternatively, the first transistor Tr1 may not be enabled sufficiently by the H-level inverter output signal. In this case, it is not possible to surely invert the output signal OUT.

In a case where the first and third transistors Tr1 and Tr3 are replaced with low breakdown voltage transistors, the first and third transistors Tr1 and Tr3 surely operate in accordance with the input signal IN and the inverter output signal. When the first and third transistors Tr1 and Tr3 are off, however, the first voltage VD1 is applied between the drain and source of each of the first and third transistors Tr1 and Tr3. In a case where the first voltage VD1 exceeds the breakdown voltage of the first and third transistors Tr1 and Tr3, therefore, the first and third transistors Tr1 and Tr3 may be broken.

SUMMARY OF THE INVENTION

Accordingly, it is a primary objective of the present invention to provide a level shift circuit which surely shifts the level of a low-voltage input signal by using high breakdown voltage elements, and a voltage generating circuit which is a constituting element of the level shift circuit.

To achieve the above object, the present invention provides a voltage generating circuit, connected between a first voltage supply having a first voltage and a second voltage supply having a second voltage lower than the first voltage, for generating at least one intermediate voltage between the first voltage and the second voltage. A plurality of voltage dividing elements is connected in series between the first voltage supply and the second voltage supply, for voltage-dividing a potential difference between the first voltage and the second voltage to generate the at least one intermediate voltage. The plurality of voltage dividing elements include a control MOS transistor which has a gate terminal and changes the at least one intermediate voltage in response to a gate voltage supplied to the gate terminal. The at least one intermediate voltage is generated at a node between adjoining two of the plurality of voltage dividing elements.

A further perspective of the present invention is a level shift circuit, connected to a first voltage supply having a first voltage, a second voltage supply having a second voltage lower than the first voltage and a third voltage supply having a third voltage higher than the second voltage and lower than the first voltage, for shifting a voltage of an input signal. An input inverter circuit is connected to the second and third voltage supplies, for receiving the input signal and inverting the input signal to thereby generate a first inverter signal. A voltage generating circuit is connected to the input inverter circuit, for voltage-dividing the first voltage in accordance with the first inverter signal to thereby generate an intermediate voltage. An output inverter circuit is connected to the first voltage supply, the second voltage supply and the voltage generating circuit, for generating a level shift output signal in accordance with the intermediate voltage.

A further perspective of the present invention is a level shift circuit, connected a first voltage supply having a first voltage, a second voltage supply having a second voltage lower than the first voltage and a third voltage supply having a third voltage higher than the second voltage and lower than the first voltage, for shifting a voltage of an input signal. An input inverter circuit is connected to the second and third voltage supplies, for receiving the input signal and inverting the input signal to thereby generate a first inverter signal. A voltage generating circuit is connected to the first voltage supply, the second voltage supply and the input inverter circuit, for voltage-dividing the first voltage in accordance with the first inverter signal to thereby generate at least one intermediate voltage. A level shift inverter circuit is connected to the voltage generating circuit and the second voltage supply, for receiving the at least one intermediate voltage and the input signal and inverting the input signal to thereby generate a level shift signal having the at least one intermediate voltage. An output inverter circuit is connected to the first voltage supply, the second voltage supply and the level shift inverter circuit, for inverting the level shift signal to thereby generate a level shift output signal.

A further perspective of the present invention is a semiconductor device, connected to a first voltage supply having a first voltage, a second voltage supply having a second voltage lower than the first voltage and a third voltage supply having a third voltage higher than the second voltage and lower than the first voltage. A first internal circuit is connected to the first and second voltage supplies to generate a first internal signal. A level shift circuit is connected to the first internal circuit, for shifting a level of first internal signal to thereby generate a second internal signal. A second internal circuit is connected to the level shift circuit and operates in accordance with the second internal signal. The level shift circuit includes an input inverter circuit, a voltage generating circuit, a level shift inverter circuit, and an output inverter circuit. The input inverter circuit is connected to the second and third voltage supplies, for receiving the first internal signal and inverting the first internal signal to thereby generate a first inverter signal. The voltage generating circuit is connected to the first voltage supply, the second voltage supply and the input inverter circuit, for voltage-dividing the first voltage in accordance with the first inverter signal to thereby generate at least one intermediate voltage. The level shift inverter circuit is connected to the voltage generating circuit and the second voltage supply, for receiving the at least one intermediate voltage and the first internal signal and inverting the first internal signal to thereby generate a level shift signal having the at least one intermediate voltage. The output inverter circuit is connected to the first voltage supply, the second voltage supply and the level shift inverter circuit, for inverting the level shift signal to thereby generate a second internal signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
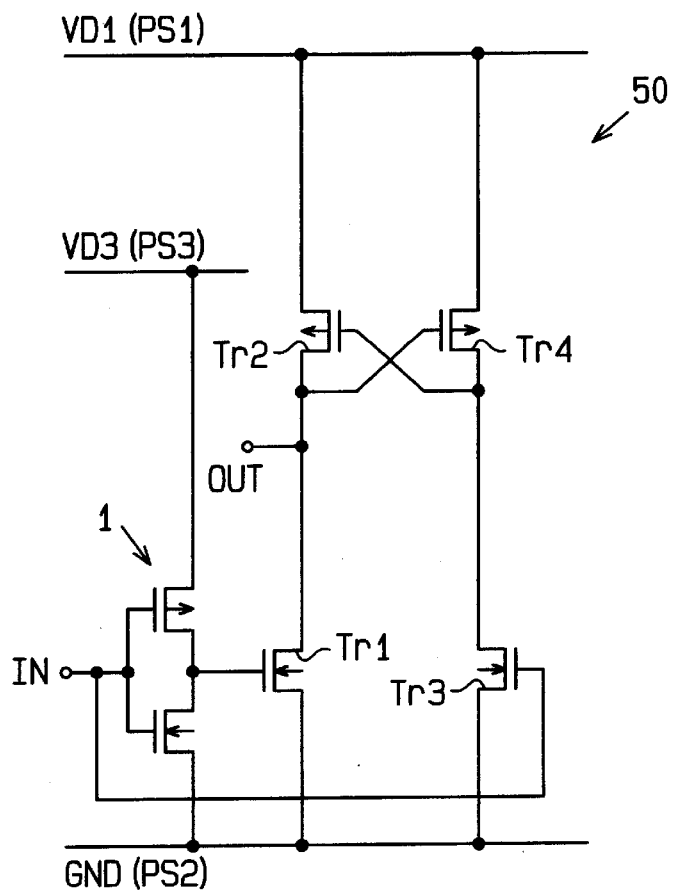
FIG. 1 is a circuit diagram of a conventional level shift circuit.
Figure 2:
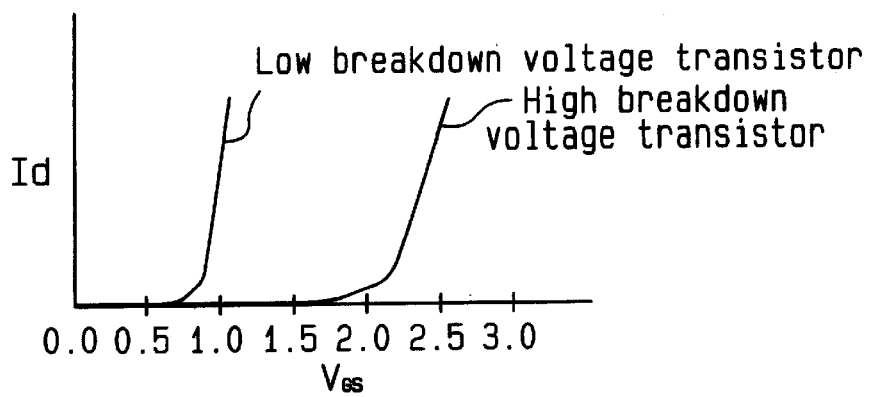
FIG. 2 is an explanatory diagram showing the characteristics of a low breakdown voltage transistor and a high breakdown voltage transistor.

In the drawings, like numerals are used for like elements throughout.

Figure 3:
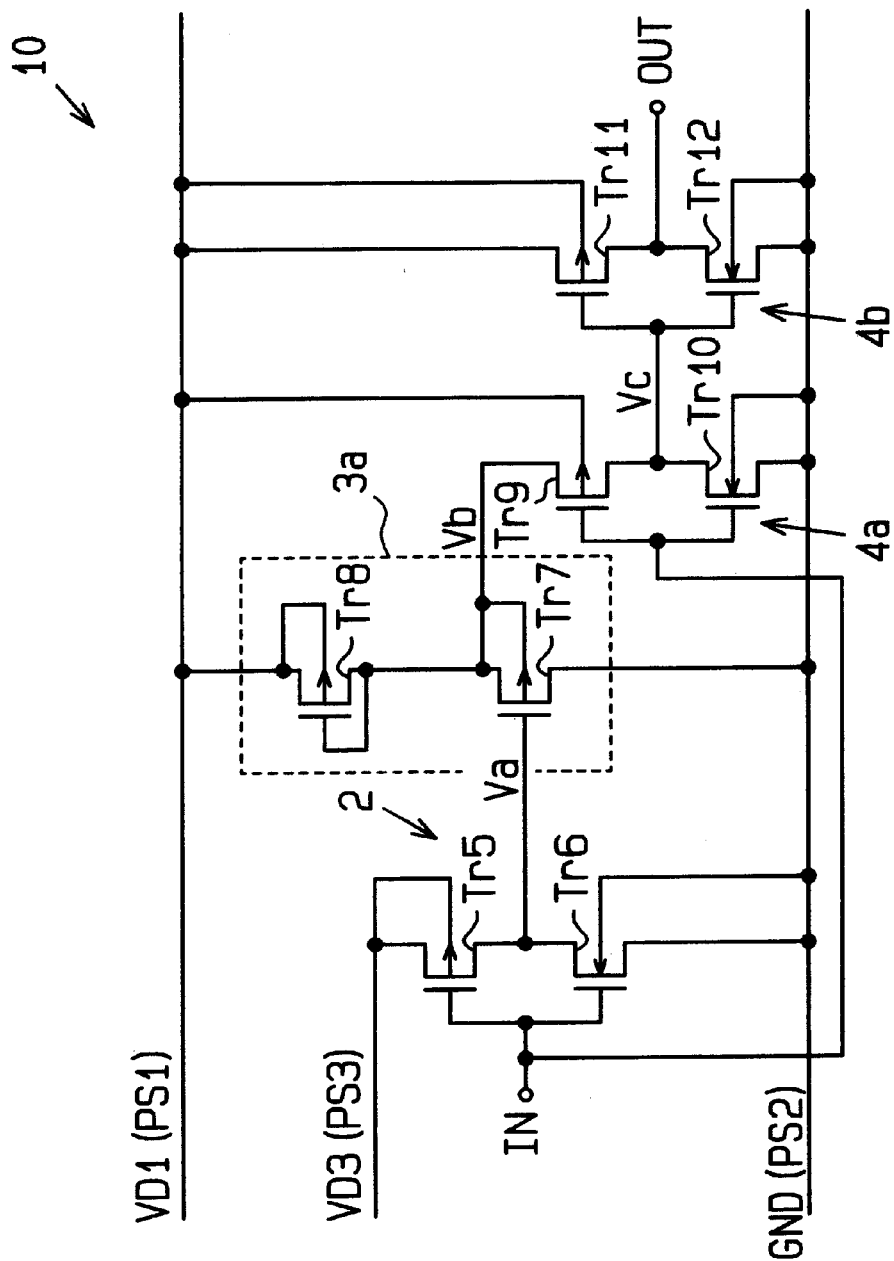
FIG. 3 is a circuit diagram of a level shift circuit according to a first embodiment of the present invention.

FIG. 3 is a circuit diagram of a level shift circuit 10 according to the first embodiment of the present invention. The level shift circuit 10 includes first to third inverter circuits 2, 4a and 4b and a voltage generating circuit 3a. Each of the first to third inverter circuits 2, 4a and 4b generates an output signal of a logical low level when receiving an input signal whose voltage is equal to or higher than ½ of a supply voltage (high-voltage side).

The level shift circuit 10 is adapted to a semiconductor device (not shown) that has internal circuits which operate on different supply voltages. The level shift circuit 10 is connected between internal circuits which operate on different supply voltages and shifts the level of a signal.

An input signal IN is supplied to the gates of a P channel MOS transistors (fifth transistor) Tr5 and an N channel MOS transistor (sixth transistor) Tr6. The source of the fifth transistor Tr5 is connected to a third voltage supply PS3, and the source of the sixth transistor Tr6 is connected to a second voltage supply PS2 (GND). A voltage VD3 of the third voltage supply PS3 (hereinafter called third voltage) is, for example, 1.5 V.

The fifth and sixth transistors Tr5 and Tr6 are low breakdown voltage transistors having a breakdown voltage of approximately 1.5 V. The back gate of the fifth transistor Tr5 is connected to the third voltage supply PS3. The back gate of the sixth transistor Tr6 is connected to the ground GND.

The first inverter circuit 2 produces a first inverter output signal Va of an L level (ground level: 0 V) when the input signal IN has an H level (1.5 V) and produces the first inverter output signal Va of the H level (1.5 V) when the input signal IN has the L level. The first inverter output signal Va is supplied to the gate of a P channel MOS transistor (seventh transistor) Tr7 whose drain is connected to the ground GND.

The source of the seventh transistor Tr7 is connected to the drain and gate of a P channel MOS transistor (eighth transistor) Tr8 whose source is connected to the first voltage supply PS1. A voltage VD1 of the first voltage supply PS1 (hereinafter called first voltage) is, for example, 3 V. The back gate of the eighth transistor Tr8 is connected to the first voltage supply PS1. The back gate of the seventh transistor Tr7 is connected to the source of the seventh transistor Tr7. The seventh and eighth transistors Tr7 and Tr8 are high breakdown voltage transistors which have a breakdown voltage of about 3 V.

The voltage generating circuit 3a includes the seventh and eighth transistors Tr7 and Tr8. An intermediate voltage Vb is generated at a node between the seventh and eighth transistors Tr7 and Tr8. The voltage generating circuit 3a generates the intermediate voltage Vb in accordance with the first inverter output signal Va. The intermediate voltage Vb is output from the source of the seventh transistor Tr7. When the first inverter output signal Va has the L level, the potentials at the gate and drain of the seventh transistor Tr7 are nearly equal to each other, thus enabling the seventh transistor Tr7. As the seventh transistor Tr7 is enabled, the eighth transistor Tr8 is enabled.

At this time, the seventh and eighth transistors Tr7 and Tr8 are enabled under the same condition (ON resistance), and the intermediate voltage Vb of the voltage generating circuit 3a is a half (approximately 1.5 V) the first voltage VD1 (3 V).

When the first inverter output signal Va has the H level, the gate-drain voltage of the seventh transistor Tr7 is about 1.5 V, so that the ON resistance of the seventh transistor Tr7 increases with respect to the eighth transistor Tr8.

Figure 5:
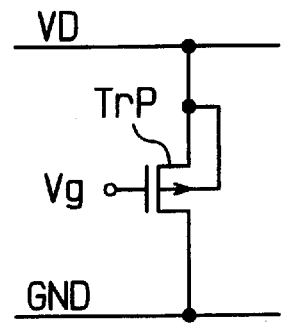
FIG. 5 is a circuit diagram showing a P channel MOS transistor.
Figure 6:
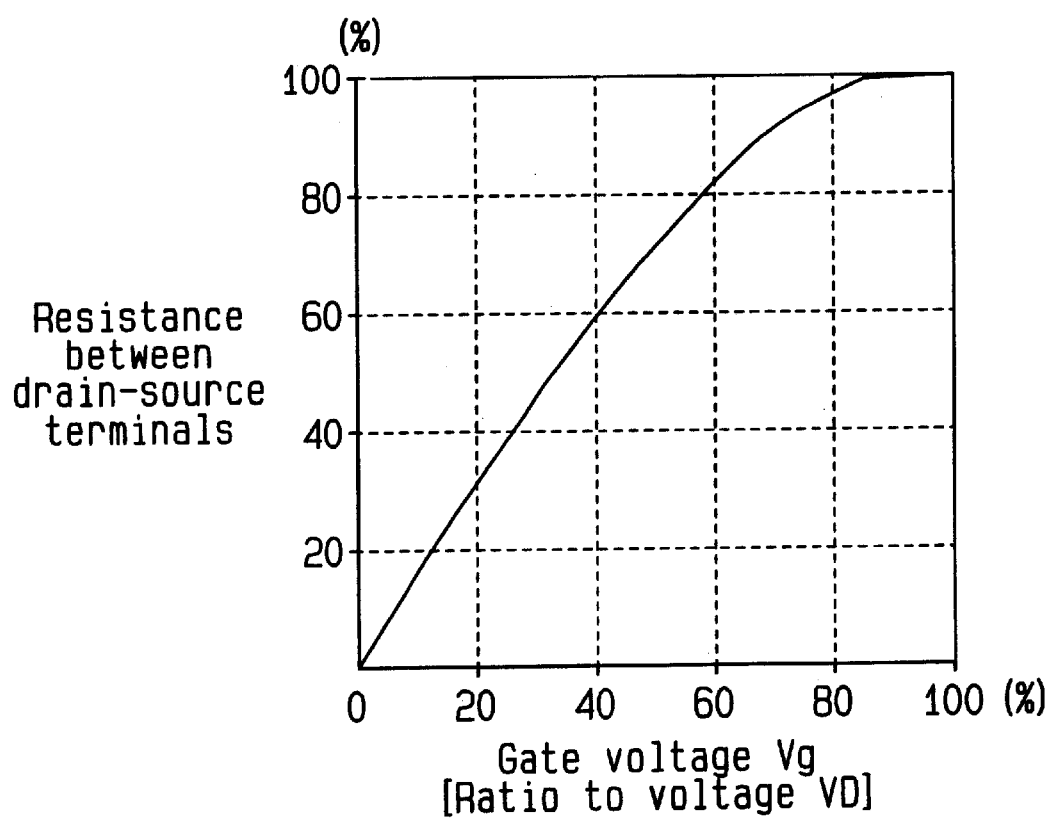
FIG. 6 is an explanatory diagram showing the characteristic of the P channel MOS transistor in FIG. 5.

FIG. 5 shows a P channel MOS transistor Trp which has a source connected to a supply voltage PS and a drain connected to the ground GND. FIG. 6 shows the relationship between a gate voltage Vg and a source-drain resistance of the transistor in FIG. 5. As shown in FIG. 6, the P channel MOS transistor Trp has such a characteristic that as the gate voltage Vg approaches the voltage of the supply voltage PS, the ON resistance between the source and drain increases.

When the first inverter output signal Va has the H level, therefore, the ON resistance of the seventh transistor Tr7 increases with respect to the ON resistance of the eighth transistor Tr8. According to the first embodiment, the intermediate voltage Vb of the voltage generating circuit 3a is set to approximately an intermediate value (2.25 V) between the first voltage VD1 and the third voltage VD3.

The input signal IN is supplied to the second inverter circuit for level shifting (level shift inverter) 4a. The second inverter circuit 4a includes a P channel MOS transistor (ninth transistor) Tr9 and an N channel MOS transistor (tenth transistor) Tr10. The intermediate voltage Vb is supplied to the source of the ninth transistor Tr9.

The source of the tenth transistor Tr10 is connected to the ground GND and the gates of the ninth and tenth transistors Tr9 and Tr10 receive the input signal IN. The back gate of the ninth transistor Tr9 is connected to the first voltage supply PS1, and the back gate of the tenth transistor Tr10 is connected to the ground GND. The ninth and tenth transistors Tr9 and Tr10 are high breakdown voltage transistors.

When the input signal IN has the H level, a second inverter signal (level shift signal) Vc has the L level, whereas when the input signal IN has the L level, the second inverter signal Vc has the H level (intermediate voltage Vb: 2.25 V).

The second inverter signal Vc is supplied to the third inverter circuit (level shift inverter) 4b. The third inverter circuit 4b includes a P channel MOS transistor (eleventh transistor) Tr11 and an N channel MOS transistor (twelfth transistor) Tr12.

The source of the eleventh transistor Tr11 is connected to the first voltage supply PS1. The source of the twelfth transistor Tr12 is connected to the ground GND. The gates of the eleventh and twelfth transistors Tr11 and Tr12 receive the second inverter signal Vc. The back gate of the eleventh transistor Tr11 is connected to the first voltage supply PS1 and the back gate of the twelfth transistor Tr12 is connected to the ground GND. The eleventh and twelfth transistors Tr11 and Tr12 are high breakdown voltage transistors.

When the second inverter signal Vc has the H level, an output signal OUT of the third inverter circuit 4b has the L level (ground level), whereas when the second inverter signal Vc has the L level, the output signal OUT has the H level (3 V).

Figure 4:
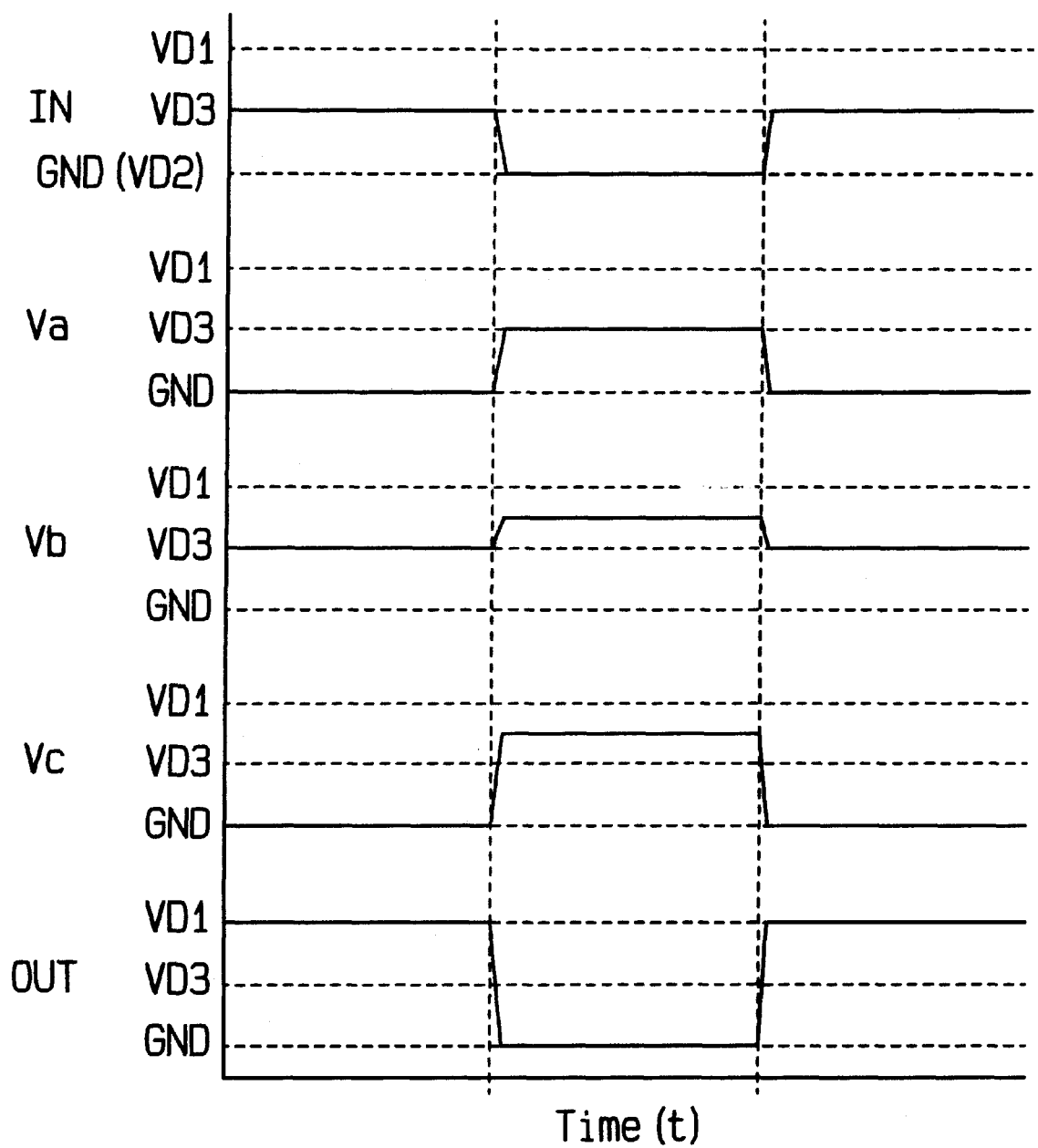
FIG. 4 is a timing waveform chart illustrating the operation of the level shift circuit in FIG. 3.

The operation of the level shift circuit 10 will be discussed below referring to FIG. 4.

When the input signal IN has the H level, the first inverter output signal Va has the ground level. The intermediate voltage Vb of the voltage generating circuit 3a is a half (1.5 V) the first voltage VD1. The second inverter signal Vc has the ground level. The output signal OUT of the inverter circuit 4b has the H level (3 V).

When the input signal IN changes to the L level, the first inverter output signal Va changes to the H level (the potential of the third voltage VD3: 1.5 V). The intermediate voltage Vb changes to an intermediate value (2.25 V) between the first voltage VD1 and the third voltage VD3 and the second inverter signal Vc changes to the H level (intermediate value: 2.25 V). Therefore, the output signal OUT of the third inverter circuit 4b changes to the L level (ground level).

The level shift circuit 10 of the first embodiment has the following advantages.

(1) When the input signal IN has the H level (third voltage VD3: 1.5 V), the intermediate voltage Vb which is a half (about 1.5 V) of the first voltage VD1 is supplied to the source of the ninth transistor Tr9 of the second inverter circuit 4a. At this time, the voltage (1.5 V) of the input signal IN is higher than a half (0.75 V) of the supply voltage to be supplied to the second inverter circuit 4a. Therefore, the second inverter circuit 4a can surely determine that the input signal IN has the H level and generate the second inverter signal Vc.

(2) When the input signal IN has the L level (ground level), the second inverter signal Vc has the H level (an intermediate value between the first voltage VD1 and the third voltage VD3: 2.25 V). At this time, the voltage (2.25 V) of the second inverter signal Vc is higher than a half (1.5 V) of the supply voltage to be supplied to the third inverter circuit 4b. Therefore, the third inverter circuit 4b can surely determine that the second inverter signal Vc has the H level and generate the output signal OUT of the L level (ground level). It is therefore possible to reliably operate the second and third inverter circuits 4a and 4b to generate the output signal OUT which is the level-shifted input signal IN.

(3) The output signal Va of the input inverter circuit 2 is input only to the gates of the transistors in the voltage generating circuit 3a and the level shift inverter circuit 4a. Therefore, the input inverter circuit 2 including low breakdown voltage transistors will not be broken by the operations of the voltage generating circuit 3a and the level shift inverter circuit 4a.

Figure 7:
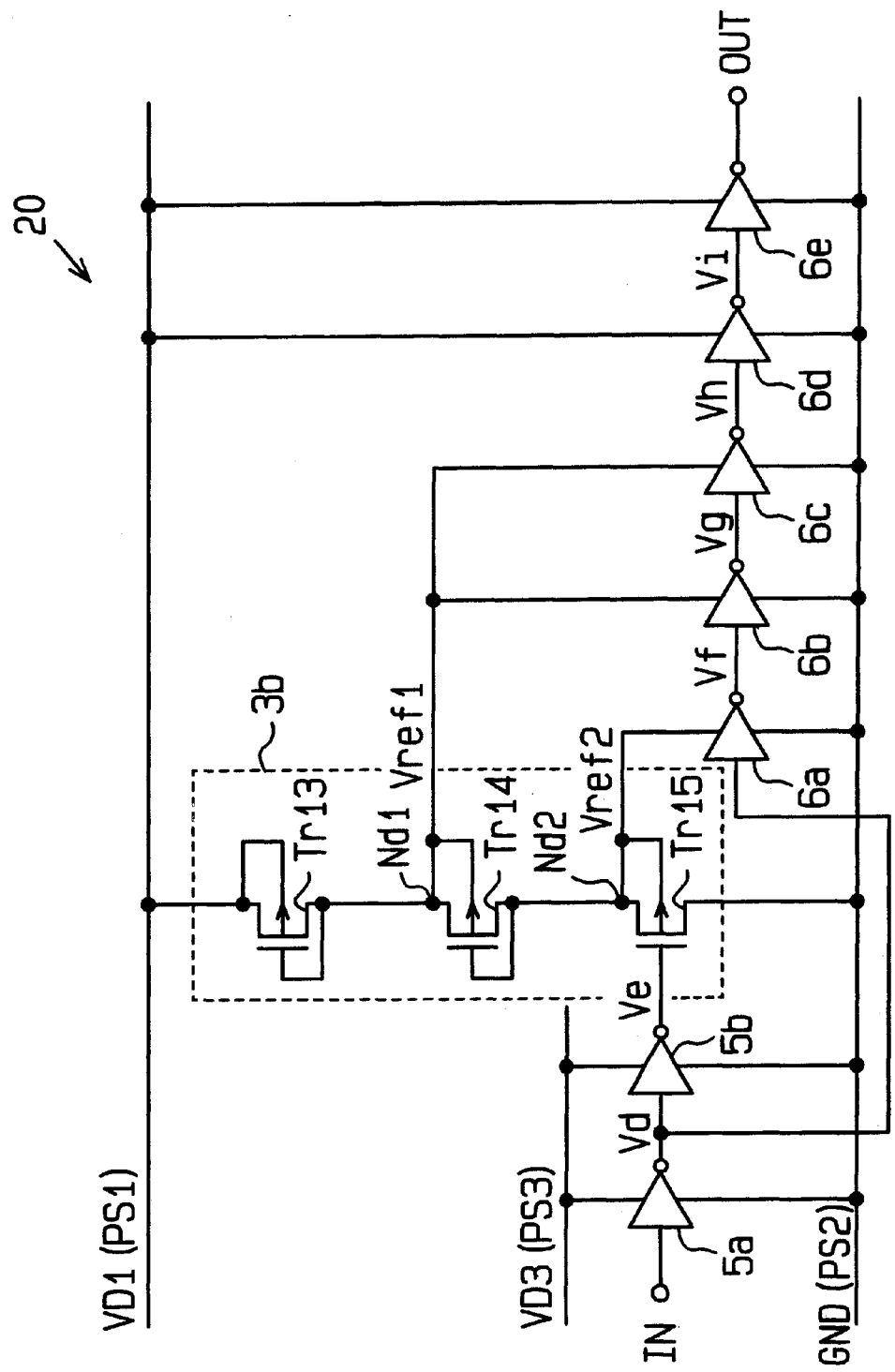
FIG. 7 is a schematic circuit diagram of a level shift circuit according to a second embodiment of the present invention.

FIG. 7 is a schematic circuit diagram of a level shift circuit 20 according to the second embodiment of the present invention. The level shift circuit 20 includes first and second inverter circuits 5a and 5b, third to seventh inverter circuits (level shift inverters) 6a to 6e connected in series, and a voltage generating circuit 3b. Each of the third to seventh inverter circuits 6a to 6e generates an output signal of a logical low level when receiving an input signal whose voltage is equal to or higher than ½ of a supply voltage (high-voltage side).

The first and second inverter circuits 5a and 5b are connected to the third voltage supply PS3 and the ground GND (second voltage supply PS2). The first and second inverter circuits 5a and 5b have a threshold value (0.5 V) with an intermediate potential between the third voltage VD3 and the ground level, and invert their output signals in accordance with the threshold value.

The input signal IN is supplied to the first inverter circuit 5a whose output signal Vd is supplied to the second inverter circuit 5b. When the input signal IN has the H level, the first inverter output signal Vd has the L level (ground level) and the output signal Ve of the second inverter circuit 5b has the H level (1 V). When the input signal IN has the L level, the first inverter output signal Vd has the H level and the second inverter output signal Ve has the L level. The first and second inverter circuits 5a and 5b include low breakdown voltage transistors having a breakdown voltage of 1 V.

The voltage generating circuit 3b includes three P channel MOS transistors (thirteenth to fifteenth transistors) Tr13 to Tr15 connected in series between the first voltage supply PS1 and the ground GND (second voltage supply PS2). The thirteenth to fifteenth transistors Tr13 to Tr15 are high breakdown voltage transistors having a breakdown voltage of 3 V. The gates of the thirteenth and fourteenth transistors Tr13 and Tr14 are respectively connected to the drains thereof. The gate of the fifteenth transistor Tr15 receives the second inverter output signal Ve.

The back gates of the transistors Tr13 to Tr15 are respectively connected to the sources thereof. A first intermediate voltage Vref1 is generated at a node Nd1 between the thirteenth and fourteenth transistors Tr13 and Tr14. A second intermediate voltage Vref2 is generated at a node Nd2 between the fourteenth and fifteenth transistors Tr14 and Tr15.

When the second inverter output signal Ve has the L level, each of the transistors Tr13 to Tr15 is enabled. The ON resistances of the enabled transistors Tr13 to Tr15 are substantially equal to one another. Therefore, the first voltage VD1 (3 V) is trisected by the transistors Tr13 to Tr15. Accordingly, the first intermediate voltage Vref1 is 2 V and the second intermediate voltage Vref2 is 1 V.

When the second inverter output signal Ve has the H level, the ON resistance of the fifteenth transistor Tr15 increases. The second intermediate voltage Vref2 is set in such a way as to be 1.6 V at this time, and the first intermediate voltage Vref1 is set in such a way as to be an intermediate potential (2.3 V) between the first voltage VD1 (3 V) and 1.6 V.

Each of the series-connected third to seventh inverter circuits 6a to 6e includes high breakdown voltage transistors having a breakdown voltage of 3 V. The third to sixth inverter circuits 6a to 6d are level shifters and the seventh inverter circuit 6e generates the output signal OUT.

The third inverter circuit 6a, which is connected to the first inverter circuit 5a, the source (node Nd2) of the fifteenth transistor Tr15 and the ground GND, receives the first inverter output signal Vd.

When the input signal IN has the H level, the first inverter output signal Vd has the L level and the second intermediate voltage Vref2 is 1.6 V. At this time, the output signal Vf of the third inverter circuit 6a has the H level (1.6 V) and the H-level third inverter output signal Vf is supplied to the fourth inverter circuit 6b.

When the input signal IN has the L level, the first inverter output signal Vd has the H level and the second intermediate voltage Vref2 is 1 V. At this time, the third inverter circuit 6a surely determines that the first inverter output signal Vd has the H level and generates the L-level third inverter output signal Vf.

Each of the fourth and fifth inverter circuits 6b and 6c is connected to the source (node Nd1) of the fourteenth transistor Tr14 and the ground GND. When the third inverter output signal Vf has the H level (1.6 V), the first intermediate voltage Vref1 is 2.3 V. Therefore, the fourth inverter circuit 6b surely determines that the third inverter output signal Vf of 1.6 V has the H level and generates an output signal Vg of the L level. The fourth inverter output signal Vg is supplied to the fifth inverter circuit 6c.

When the third inverter output signal Vf has the L level, the first intermediate voltage Vref1 is 2 V. Therefore, the fourth inverter circuit 6b generates the output signal Vg of the H level (2 V) and sends the H-level fourth inverter output signal Vg to the fifth inverter circuit 6c.

When the fourth inverter output signal Vg has the H level, the first intermediate voltage Vref1 is 2 V, so that the fifth inverter circuit 6c surely determines that the fourth inverter output signal Vg has the H level and generates an output signal Vh of the L level. The fifth inverter output signal Vh is supplied to the sixth inverter circuit 6d.

When the fourth inverter output signal Vg has the L level, the first intermediate voltage Vref1 is 2.3 V. At this time, the fifth inverter circuit 6c generates the fifth inverter output signal Vh of the H level (2.3 V) and sends the H-level fifth inverter output signal Vh to the sixth inverter circuit 6d.

Both the sixth and seventh inverter circuits 6d and 6e are connected to the first voltage VD1 (3 V) and the ground GND. When the fifth inverter output signal Vh has the H level (2.3 V), the voltage of the output signal Vh is greater than an intermediate voltage (1.5 V) between the first voltage VD1 and the ground GND, so that the sixth inverter circuit 6d surely determines that the fifth inverter output signal Vh has the H level. The sixth inverter circuit 6d generates a sixth inverter output signal Vi of the L level and sends the L-level sixth inverter output signal Vi to the seventh inverter circuit 6e. The seventh inverter circuit 6e inverts the sixth inverter output signal Vi, thus generating the H-level output signal OUT.

When the fifth inverter output signal Vh has the L level (ground level), the sixth inverter circuit 6d generates the sixth inverter output signal Vi of the H level (first voltage VD1: 3 V) and sends the H-level sixth inverter output signal Vi to the seventh inverter circuit 6e. The seventh inverter circuit 6e inverts the sixth inverter output signal Vi, thus generating the L-level output signal OUT.

Because the output signal OUT is produced via the first and third to seventh inverter circuits 5a and 6a–6e in the sixth stages, the input signal IN is in phase with the output signal OUT.

The level shift circuit 20 of the second embodiment has the following advantages.

(1) When the input signal (first inverter output signal) Vd has the H level (third voltage VD3: 1 V), the second intermediate voltage (high-voltage side supply voltage) Vref2 having 1/3(1 V) of the first voltage VD1 is supplied to the third inverter circuit 6a from the voltage generating circuit 3b. The voltage (1 V) of the input signal IN is higher than 1/2 (0.5 V) of the supply voltage to be supplied to the third inverter circuit 6a. Therefore, the third inverter circuit 6a can surely determine that the input signal IN has the H level, and can generate the third inverter output signal Vf of the L level (ground level).

(2) When the input signal IN has the H level, the third inverter circuit 6a receives the second intermediate voltage Vref2 of 1.6 V from the voltage generating circuit 3b. The fourth inverter circuit 6b receives the first intermediate voltage Vref1 of 2.3 V. At this time, the voltage of the third inverter output signal Vf has an H-level voltage of 1.6 V, which is higher than the intermediate level (1.15 V) of the first intermediate voltage Vref1. Therefore, the fourth inverter circuit 6b can surely determine that the input signal Vf has the H level, and can generate the fourth inverter output signal Vg of the L level.

(3) When the fourth inverter output signal Vg has the L level, the fifth inverter output signal Vh has the H level (2.3 V). The voltage of the fifth inverter output signal Vh is higher than the intermediate level (1.5 V) of the first voltage VD1. Therefore, the sixth inverter circuit 6d can surely determine that the input signal Vh has the H level, and can generate the sixth inverter output signal Vi of the L level.

(4) The voltage generating circuit 3b can divide the first voltage VD1 so that the third to seventh inverter circuits 6a to 6e can be driven on three levels of supply voltages. Even in case where the third voltage VD3 is lower than the one in the first embodiment, therefore, it is possible to reliably operate the third to seventh inverter circuits 6a to 6e which are high breakdown voltage transistors.

It should be apparent to those skilled in the art that the present invention may be embodied in many other specific forms without departing from the spirit or scope of the invention. Particularly, it should be understood that the invention may be embodied in the following forms.

In the voltage generating circuit, four or more P channel MOS transistors may be connected in series to generate three or more types of output voltages.

An N channel MOS transistor may be used in place of each P channel MOS transistor in the voltage generating circuit. In this case, the gate voltage of the transistor positioned on the highest potential side is controlled and the gates of the other transistors are respectively connected to the drains thereof.

In the voltage generating circuit, each transistor whose gate is connected to its drain may be replaced with a fixed resistor.

Therefore, the present examples and embodiments are to be considered as illustrative and not restrictive and the invention is not to be limited to the details given herein, but may be modified within the scope and equivalence of the appended claims.

What is claimed is:

1. A voltage generating circuit, connected between a first voltage supply having a first voltage and a second voltage supply having a second voltage lower than the first voltage, for generating at least one intermediate voltage between the first voltage and the second voltage, comprising:
   a plurality of P channel MOS transistors, connected in series between the first voltage supply and the second voltage supply, for voltage-dividing a potential difference between the first voltage and the second voltage to generate the at least one intermediate voltage,
   wherein each of the P channel MOS transistors has a gate terminal and first and second signal terminals,
   the plurality of P channel MOS transistors including a control P channel MOS transistor which changes the at least one intermediate voltage in response to a gate voltage supplied to the gate terminal,
   the gate terminal of each of the other MOS transistors than the control P channel MOS transistor being connected to one of the associated first and second signal terminals,
   the at least one intermediate voltage being generated at a node between adjoining two of the plurality of P channel MOS transistors.

2. The voltage generating circuit according to claim 1, wherein the control P channel MOS transistor has an ON resistance to be controlled by the gate voltage.

3. The voltage generating circuit according to claim 1, wherein each of other P channel MOS transistors than the control P channel MOS transistor is a fixed resistor.

4. A level shift circuit, connected to a first voltage supply having a first voltage, a second voltage supply having a second voltage lower than the first voltage and a third voltage supply having a third voltage higher than the second voltage and lower than the first voltage, for shifting a voltage of an input signal, the level shift circuit comprising:
   an input inverter circuit, connected to the second and third voltage supplies, for receiving the input signal and inverting the input signal to thereby generate a first inverter signal;
   a voltage generating circuit, connected to the input inverter circuit, for voltage-dividing the first voltage in accordance with the first inverter signal to thereby generate an intermediate voltage, and
   an output inverter circuit, connected to the first voltage supply, the second voltage supply and the voltage generating circuit, for generating a level shift output signal in accordance with the intermediate voltage.

5. The level shift circuit according to claim 4, wherein the output inverter circuit generates the level shift output signal of a logical low level when the intermediate voltage is equal to or higher than ½ of the first voltage.

6. The level shift circuit according to claim 5, wherein the output inverter circuit generates the level shift output signal having the first voltage in accordance with the second voltage.

7. A level shift circuit, connected a first voltage supply having a first voltage, a second voltage supply having a second voltage lower than the first voltage and a third voltage supply having a third voltage higher than the second voltage and lower than the first voltage, for shifting a voltage of an input signal, the level shift circuit comprising:
   an input inverter circuit, connected to the second and third voltage supplies, for receiving the input signal and inverting the input signal to thereby generated a first inverter signal;
   a voltage generating circuit, connected to the first voltage supply, the second voltage supply and the input inverter circuit, for voltage-dividing the first voltage in accordance with the first inverter signal to thereby generate at least one intermediate voltage;
   a level shift inverter circuit, connected to the voltage generating circuit and the second voltage supply, for receiving the at least one intermediate voltage and the input signal and inverting the input signal to thereby generate a level shift signal having the at least one intermediate voltage; and
   an output inverter circuit, connected to the first voltage supply, the second voltage supply and the level shift inverter circuit, for inverting the level shift signal to thereby generate a level shift output signal.

8. The level shift circuit according to claim 7, wherein the level shift inverter circuit generates the level shift signal of a logical low level when the voltage of the input signal is equal to or higher than ½ of the intermediate voltage, and
   the output inverter circuit generates the level shift output signal of a logical low level when the intermediate voltage of the level shift signal is equal to or higher than ½ of the first voltage.

9. The level shift circuit according to claim 8, wherein the output inverter circuit generates the level shift output signal having the first voltage when the level shift signal has the logical low level.

10. The level shift circuit according to claim 7, wherein the input inverter circuit includes a low breakdown voltage transistor,
   each of the voltage generating circuit, the level shift inverter circuit and the output inverter circuit includes a high breakdown voltage transistor,
   the level shift inverter circuit generates the level shift signal of a logical low level when the voltage of the input signal is equal to or higher than ½ of the intermediate voltage, and
   the output inverter circuit generates the level shift output signal of a logical low level when the voltage of the level shift signal is equal to or higher than ½ of the first voltage.

11. The level shift circuit according to claim 7, wherein the voltage generating circuit includes:
   a plurality of voltage dividing elements, connected in series between the first voltage supply and the second voltage supply, for voltage-dividing a potential difference between the first voltage and the second voltage to generate the at least one intermediate voltage, the plurality of voltage dividing elements including a control MOS transistor which has a gate terminal and changes the at least one intermediate voltage in response to a gate voltage supplied to the gate terminal,
   the at least one intermediate voltage being generated at a node between adjoining two of the plurality of voltage dividing elements.

12. The level shift circuit according to claim 11, wherein the plurality of voltage dividing elements are a plurality of MOS transistors each having a gate terminal and first and second signal terminals, and
   the gate terminal of each of other voltage dividing elements than the control MOS transistor is connected to one of the first and second signal terminals associated.

13. The level shift circuit according to claim 12, wherein each of the plurality of MOS transistors is a P channel MOS transistor.

14. The level shift circuit according to claim 11, wherein a phase of the input signal of the level shift inverter circuit is opposite to a phase of the gate voltage of the control MOS transistor.

15. The level shift circuit according to claim 11, wherein the gate voltage of the control MOS transistor is a voltage of the first inverter signal of the input inverter circuit, and
   the level shift inverter circuit includes an MOS transistor having a gate terminal to which the input signal is supplied.

16. The level shift circuit according to claim 7, wherein the level shift inverter circuit is one of a plurality of level shift inverter circuits each connected to the voltage generating circuit and connected in series to one another, and
   each of the plurality of level shift inverter circuits generates a level shift signal having one of the at least one intermediate voltage.

17. The level shift circuit according to claim 16, wherein the plurality of level shift inverter circuits connected in series to one another include at least two level shift inverter circuits for receiving a same intermediate voltage, and
   an input signal of a last stage level shift inverter circuit in the at least two level shift inverter circuits which receive the same intermediate voltage is in phase with an input signal of a first stage level shift inverter circuit in the plurality of level shift inverter circuits.

18. A semiconductor device, connected to a first voltage supply having a first voltage, a second voltage supply having a second voltage lower than the first voltage and a third voltage supply having a third voltage higher than the second voltage and lower than the first voltage, the semiconductor device comprising:
   a first internal circuit, connected to the first and second voltage supplies, for generating a first internal signal;
   a level shift circuit, connected to the first internal circuit, for shifting a level of first internal signal to thereby generate a second internal signal; and
   a second internal circuit which is connected to the level shift circuit and operates in accordance with the second internal signal,
   the level shift circuit including:
      an input inverter circuit, connected to the second and third voltage supplies, for receiving the first internal signal and inverting the first internal signal to thereby generate a first inverter signal;
      a voltage generating circuit, connected to the first voltage supply, the second voltage supply and the input inverter circuit, for voltage-dividing the first voltage in accordance with the first inverter signal to thereby generate at least one intermediate voltage;
      a level shift inverter circuit, connected to the voltage generating circuit and the second voltage supply, for receiving the at least one intermediate voltage and the first internal signal and inverting the first internal signal to thereby generate a level shift signal having the at least one intermediate voltage; and
      an output inverter circuit, connected to the first voltage supply, the second voltage supply and the level shift inverter circuit, for inverting the level shift signal to thereby generate a second internal signal.

19. A voltage generating circuit, connected between a first voltage supply having a first voltage and a second voltage supply having a second voltage lower than the first voltage, for generating at least one intermediate voltage between the first voltage and the second voltage, comprising:
   a plurality of MOS transistors, connected in series between the first voltage supply and the second voltage supply, for voltage-dividing a potential difference between the first voltage and the second voltage to generate the at least one intermediate voltage, wherein each of the MOS transistors has a gate terminal and first and second signal terminals,
   the plurality of MOS transistors including a control MOS transistor which changes the at least one intermediate voltage in response to a gate voltage supplied to the gate terminal,
   the gate terminal of each of the other MOS transistors than the control MOS transistor being connected to one of the associated first and second signal terminals,
   the at least one intermediate voltage being generated at a node between adjoining two of the plurality of MOS transistors,
   wherein the plurality of MOS transistors include:
      a first P channel MOS transistor connected to the first voltage supply;
      a second P channel MOS transistor, connected to the first P channel MOS transistor, for generating a first intermediate voltage at a node between the first P channel MOS transistor and the second P channel MOS transistor; and
      a third P channel MOS transistor, connected to the second P channel MOS transistor and the second voltage supply, for generating a second intermediate voltage at a node between the second P channel MOS transistor and the third P channel MOS transistor and changing the first and second intermediate voltages in accordance with the gate voltage supplied to the gate terminal of the third P channel MOS transistor.

* * * * *